United States Patent
Ohuchi et al.

[19]

[11] Patent Number: 6,130,480
[45] Date of Patent: Oct. 10, 2000

[54] STRUCTURE FOR PACKAGING SEMICONDUCTOR CHIP

[75] Inventors: Shinji Ohuchi; Yoshimi Egawa, both of Tokyo, Japan

[73] Assignee: Oki Electric Industry Co., Ltd., Tokyo, Japan

[21] Appl. No.: 09/050,971

[22] Filed: Mar. 31, 1998

[30] Foreign Application Priority Data

Aug. 20, 1997 [JP] Japan ................................. 9-224120

[51] Int. Cl.[7] .................................................... H01L 23/48
[52] U.S. Cl. .......................... 257/738; 257/778; 257/786
[58] Field of Search ................... 257/738, 739, 257/778, 701, 702, 782, 786

[56] References Cited

U.S. PATENT DOCUMENTS 5,379,191  1/1995  Carey et al. ............................ 257/776
5,444,301  8/1995  Song et al. .

FOREIGN PATENT DOCUMENTS 0 798 780 A2  10/1997  European Pat. Off. .
62-296431     12/1987  Japan .
4-37044        2/1992  Japan .
9-181122       7/1997  Japan .

OTHER PUBLICATIONS

Tetsuya Koyama et al., "Advanced CSP and Substrate Technologies," Proceedings. 1996 International Symposium on Microelectronics (SPIE vol. 2920), 1996 International Symposium on Microelectronics, Minneapolis, MN, USA Oct. 8–10, 1996, pp. 265–270.

*Primary Examiner*—Carl Whitehead, Jr.
*Assistant Examiner*—Roy Potter
*Attorney, Agent, or Firm*—Jones Volentine, L.L.P.

[57]  ABSTRACT

Described herein are a structure and a method for packaging a semiconductor chip. The structure comprises a semiconductor chip having a plurality of bumps formed thereon, a substrate having copper-made wiring patterns with the bumps joined thereto, which are formed so as to correspond to forming positions of the bumps, and a polyimide tape having adhesive layers provided on both surfaces for joining the semiconductor chip and the substrate to one another upon positioning. A spacing defined between the semiconductor chip and the substrate is sealed with a resin layer. A material for the substrate is selected so that a thermal expansion coefficient of the substrate is substantially equal to that of the polyimide tape. Owing to the above construction, it is possible to reduce the chance that a contact failure may occur, by increasing bonding powers between the bumps and the wiring patterns and avoid cracks from being produced on the surface of the semiconductor chip due to a change in temperature at its manufacture.

12 Claims, 6 Drawing Sheets

STRUCTURE FOR PACKAGING SEMICONDUCTOR CHIP

BACKGROUND OF THE INVENTION

1. Field of the Invention

This invention relates to a structure and a method for packaging a semiconductor chip such as an LSI chip or the like on a circuit substrate.

2. Description of the Related Art

As a method of packaging a semiconductor chip on a circuit board or substrate, one has been used which face down connects a semiconductor chip having a plurality of projected electrodes (bumps) formed on the surface thereof to an internal substrate having conduction patterns formed at their corresponding points of bumps.

Japanese Patent Application Laid-Open No. 5-41404 discloses this type of semiconductor chip packaging method. According to the method disclosed in the present publication, when respective bumps formed on a semiconductor device are joined to wiring patterns on a circuit substrate so as to fit the wiring patterns, a thermosetting resin sheet is bonded between the semiconductor device and the circuit substrate so that a state in which the respective bumps are pressed against their corresponding wiring patterns, is satisfactorily held.

However, the packaging method disclosed in the aforementioned publication has the potential that since the fixing of the semiconductor device to the circuit substrate at the time of completion of the packaging depends only on a bonding or joining power produced by the resin sheet, the bonding power will be reduced particularly when the area at which the resin sheet makes contact with each of the semiconductor device and the circuit substrate is small and contacts between the bumps and the circuit patterns will be at fault due to deterioration over time. Although the resin sheet and the circuit substrate have not referred to their thermal expansion coefficients in the aforementioned publication, stresses developed due to the difference in thermal expansion coefficient between the semiconductor device and the substrate when they are returned to the normal temperature after having been pressurized and heated, are concentrated on the bumps when the thermal expansion coefficients of the resin sheet and the circuit substrate are different from each other. Thus, there is a possibility that cracks may occur in the surface of the semiconductor device.

SUMMARY OF THE INVENTION

With the foregoing in view, it is therefore a first object of the present invention to provide a structure and a method for packaging a semiconductor chip, which are capable of reducing the chance that a failure in contact between bumps and circuit patterns will occur.

It is a second object of the present invention to provide a structure and a method for packaging a semiconductor chip, which no result in the occurrence of cracks in the surface of the semiconductor chip due to a change in temperature at its manufacture.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
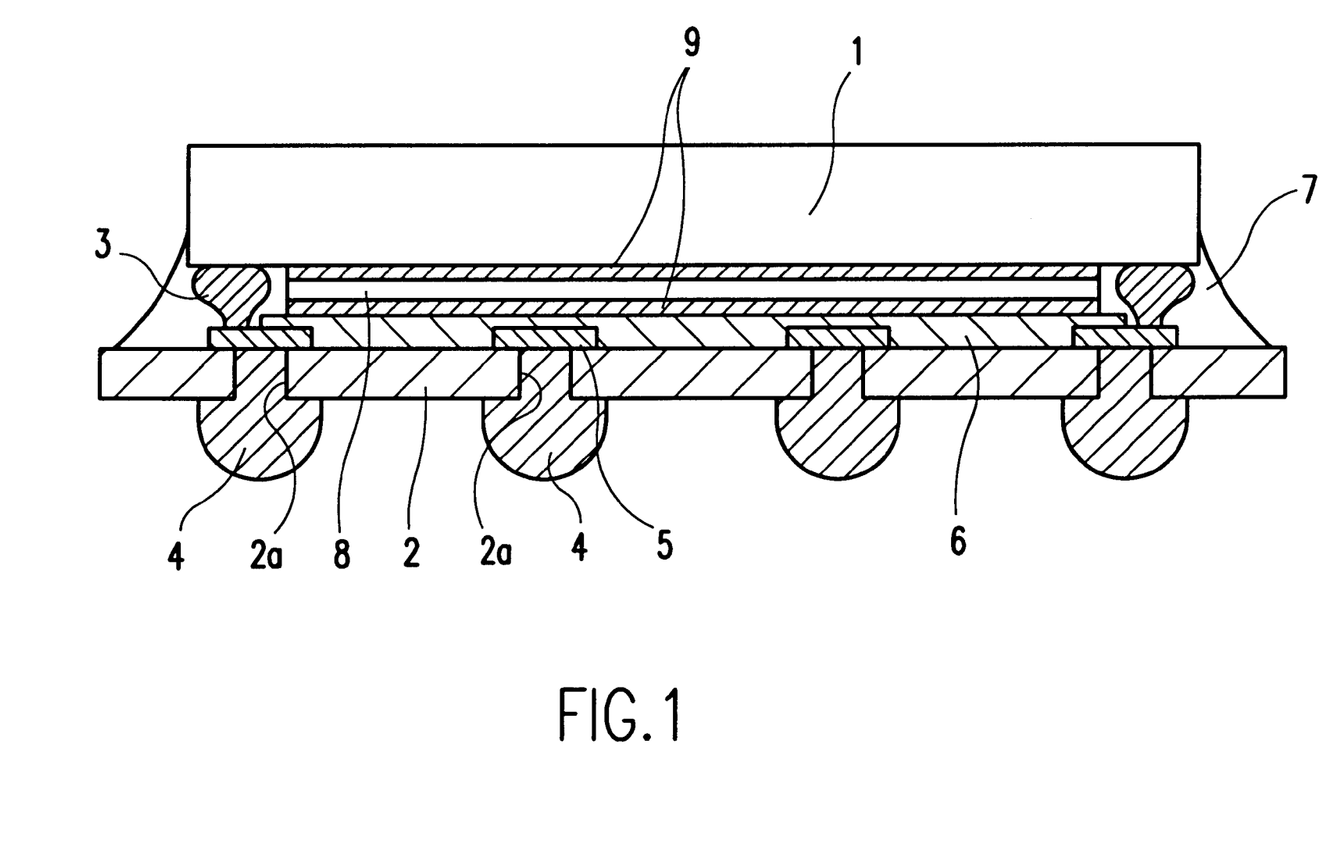
FIG. 1 is a cross-sectional view showing a structure for packaging a semiconductor chip, according to a first embodiment of the present invention.

FIG. 1 is a cross-sectional view showing a structure for packaging a semiconductor chip, according to a first embodiment of the present invention. The structure according to the first embodiment comprises a semiconductor chip 1 having a plurality of bumps 3 formed on a circuit forming surface thereof which serves as a lower surface thereof as seen in the drawing, a substrate 2 on which copper-made wiring patterns 5 with the bumps 3 joined thereto are formed so as to correspond to forming positions of the bumps 3, and a polyimide tape 8 having adhesive layers 9 provided on both surfaces thereof. A spacing defined between the semiconductor chip 1 and the substrate 2 is sealed with a resin layer 7.

Through holes 2a, which extend through the substrate 2, are defined in the substrate 2 at their corresponding positions where the wiring patterns 5 are provided. Solder balls 4 are formed on the back side corresponding to the lower side of the substrate 2 as seen in the drawing as electrodes so that they be electrically connected to their corresponding wiring patterns 5 via the through holes 2a. An insulating film or layer 6 for covering the wiring patterns 5 unjoined to the bumps 3 is formed on the surface of the substrate 2, which is located on the joining side of the semiconductor chip 1. In the first embodiment, a material for the substrate 2 is selected so that a thermal expansion coefficient of the substrate 2 is substantially equal to that of the polyimide tape 8.

Figure 2A:
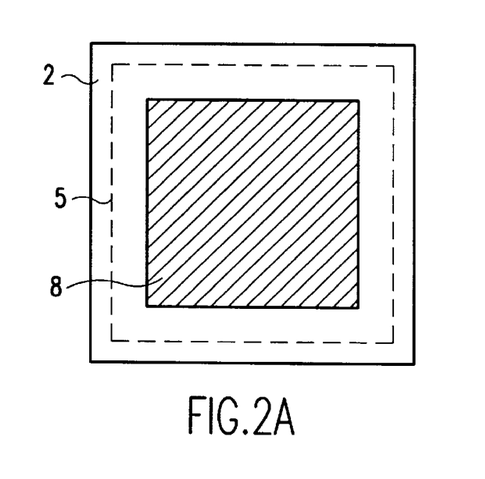
FIG. 2(A) is a plan view illustrating a substrate of the packaged structure of the semiconductor chip shown in FIG. 1 with a polyimide tape affixed to one continuous region.
Figure 2B:
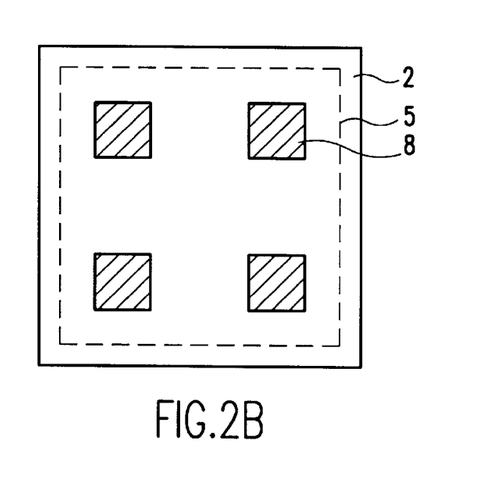
FIG. 2(B) is a plan view illustrating a substrate of the packaged structure of the semiconductor chip shown in FIG. 1, with a polyimide tape affixed to separate points.

In the first embodiment, as shown in FIGS. 2(A) and 2(B), the wiring patterns 5 corresponding to the bumps 3 are provided at a peripheral portion of the substrate 2 and the polyimide tape 8 serving as a bonding or joining material is placed in or affixed to the central portion of the substrate 2 with a thickness substantially identical to that of each bump 3. As shown in FIG. 2(A), the polyimide tape 8 may be affixed to one continuous region. Alternatively, the polyimide tape 8 may be placed in plural points, i.e., four points in separate form as shown in FIG. 2(B) in the present embodiment.

Figure 3:
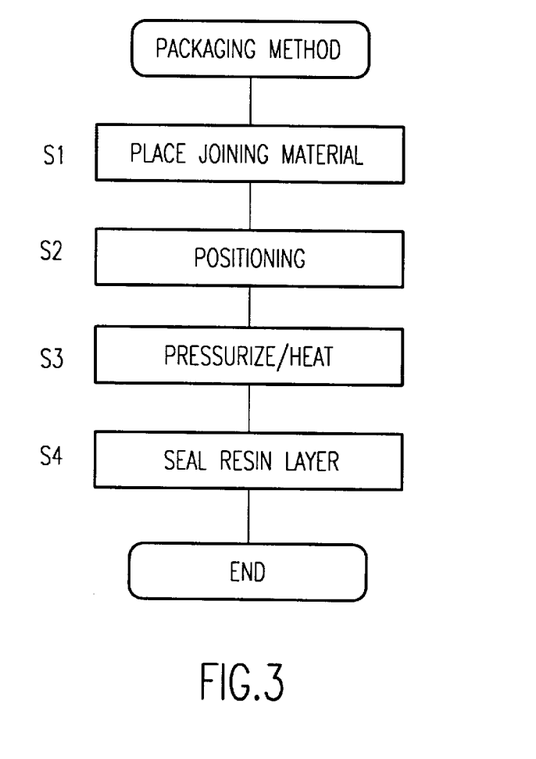
FIG. 3 is a flowchart for describing a packaging method for constructing the packaged structure of the semiconductor chip shown in FIG. 1.
Figure 4:
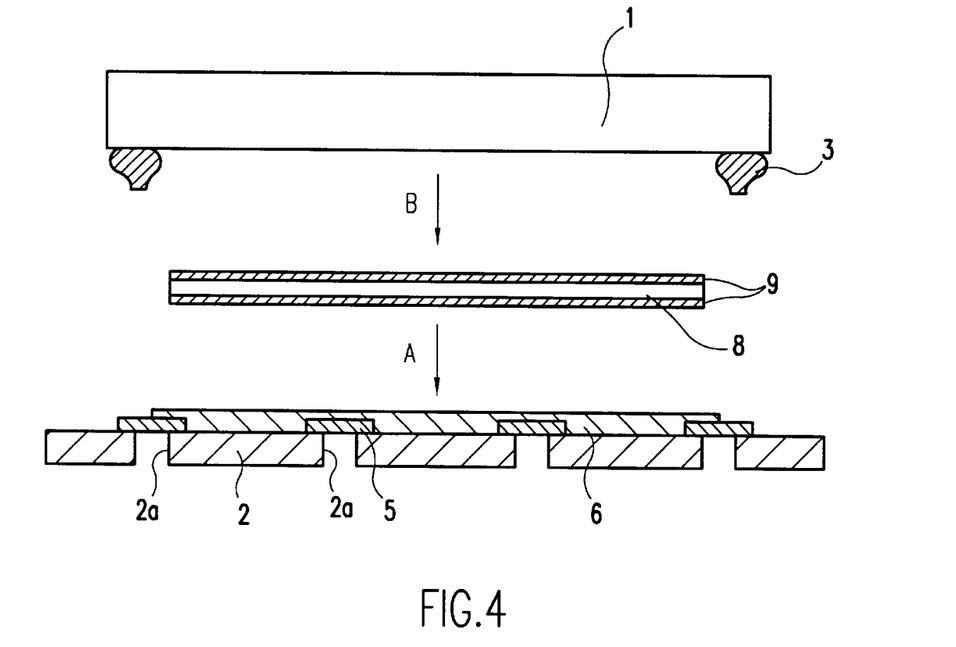
FIG. 4 is an exploded view for describing the packaging method shown in FIG. 3.

A method of packaging the structure according to the first embodiment comprises four stages: a joining material placing or laying-out stage S1, a positioning stage S2, a pressurizing/heating stage S3 and a resin layer sealing stage S4 as shown in a flowchart of FIG. 3. The individual stages will be explained by reference to an exploded view shown in FIG. 4. As a stage prior to the packaging, the semiconductor chip 1 with the bumps 3 formed thereon, the polyimide tape 8 having the adhesive layers 9 formed on both surface thereof, and the substrate 2 having the through holes 2a on which the wiring patterns 5 are formed, are prepared as shown in FIG. 4. The unused wiring patterns of the wiring patterns 5 provided on the substrate 2 are covered with the insulating layer 6.

In the joining material laying-out stage S1, the polyimide tape 8 having the adhesive layers 9 formed on both surfaces thereof is placed on the insulating layer 6 in the center of the substrate 2 as indicated by arrow A in FIG. 4. In the positioning stage S2, the semiconductor chip 1 and the substrate 2 are positioned so that the bumps 3 are brought into alignment with the wiring patterns 5. Further, the semiconductor chip 1 is fixed to the substrate 2 with the polyimide tape 8 interposed therebetween as indicated by arrow B in FIG. 4.

In the pressurizing/heating stage S3, the semiconductor chip 1 fixed to the substrate 2 and the substrate 2 are heated to about 300° C. while they are being pressurized, thereby joining the bumps 3 and the wiring patterns 5 to one another. In the resin layer sealing stage S4, the bumps 3 and the wiring patterns 5 are returned to the normal temperature after they have been joined to one another and the spacing defined between the semiconductor chip 1 and the substrate 2 is sealed with the resin layer 7.

According to the structure and method of the first embodiment, since the semiconductor chip 1 and the substrate 2 are firmly joined to one another by three bonding or joining forces or powers: a joining power developed between the bumps 3 and the wiring patterns 5, a joining power produced by the polyimide tape 8 and a joining power produced by the sealing resin layer 7, a strong bonding power is obtained even if a joining area of the polyimide tape 8 is small, thereby making it possible to reduce the chance that a contact failure may occur due to deterioration over time.

Further, since the polyimide tape 8 is provided with substantially the same thickness as that of the bump 3, the pressure applied in the pressurizing/heating stage is distributed not only over the bumps but also over a bonded portion of the adhesive tape 8, thereby making it possible to avoid cracks from occurring in bump forming portions of the semiconductor chip 1.

Further, since the thermal expansion coefficient of the substrate 2 is set so as to be substantially equal to that of the polyimide tape 8 in the first embodiment, the polyimide tape 8 is contracted to the same degree as for the substrate 2 and a stress produced due to the difference in thermal expansion coefficient between the semiconductor chip 1 and the substrate 2 can be distributed not only over the bumps 3 but also over the polyimide tape 8. The thermal expansion coefficient of the semiconductor chip 1 is lower than that of the substrate 2. Upon cooling of the semiconductor chip 1 and the substrate 2 after they have been heated, the substrate 2 side is contracted greater. Assuming now that the polyimide tape 8 is contracted to the same degree as for the substrate 2, the semiconductor chip 1 undergoes a stress developed by its contraction not only at the bumps 3 but also at the bonded portion of the polyimide tape 8. It is thus possible to avoid the concentration of the stress on a local portion of the semiconductor chip 1 and the occurrence of the cracks in the semiconductor chip 1. When the thermal expansion coefficient of the polyimide tape 8 is close to that of the semiconductor chip 1 in contrast to this, the polyimide tape 8 is contracted to the same level as for the semiconductor chip. Therefore, no stress is produced between the two and the stress developed between the semiconductor chip 1 and the substrate 2 is concentrated on the bumps. This will result in the occurrence of the cracks.

Figure 5:
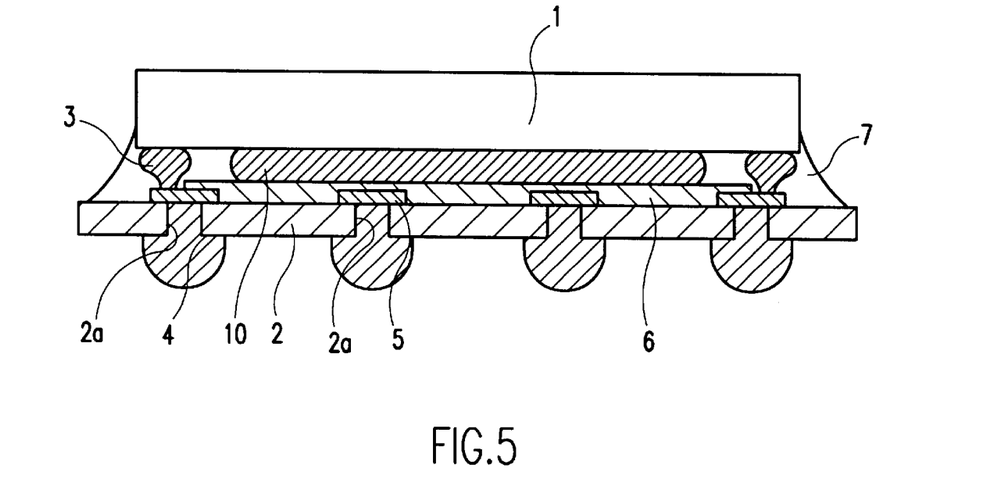
FIG. 5 is a cross-sectional view depicting a structure for packaging a semiconductor chip, according to a second embodiment of the present invention.
Figure 6:
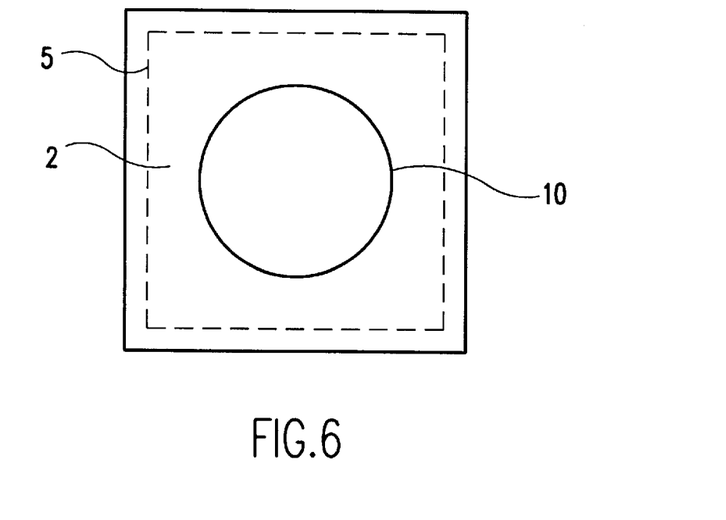
FIG. 6 is a plan view showing a substrate of the packaged structure of the semiconductor chip shown in FIG. 5.

FIG. 5 is a cross-sectional view showing a structure for packaging a semiconductor chip, according to a second embodiment of the present invention. In the second embodiment, a quick-curing resin 10 faster than a resin for forming a resin layer 7 in curing is used as a bonding or joining material. The quick-curing resin 10 has a thickness substantially identical to that of each of bumps 3. The second embodiment is identical in other configuration to the first embodiment shown in FIG. 1. Even in the second embodiment, as shown in FIG. 6, wiring patterns 5 corresponding to the bumps 3 are provided at a peripheral portion of a substrate 2 and the quick-curing resin 10 serving as the bonding material is applied to the central portion of the substrate 2.

Figure 7:
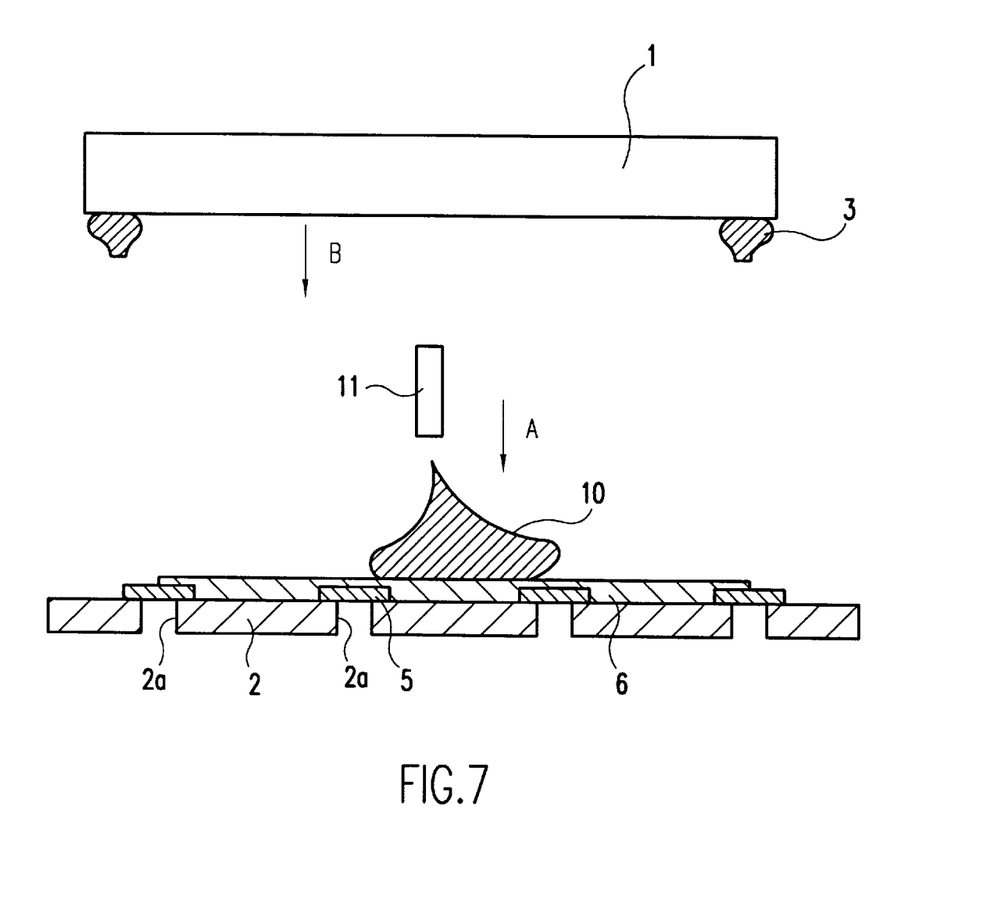
FIG. 7 is an exploded view for explaining a packaging method for constructing the packaged structure shown in FIG. 5.

In a stage prior to the packaging of the structure according to the second embodiment, a semiconductor chip 1 with bumps 3 formed thereon and a substrate 2 having wiring patterns 5 formed on through holes 2a are prepared as shown in FIG. 7. Unused wiring patterns of the wiring patterns 5 provided on the substrate 2 are covered with an insulating layer 6. A method of packaging the structure according to the second embodiment is substantially the same as the method according to the first embodiment shown in FIG. 3. In a joining material laying-out stage S1, however, the quick-curing resin 10 is supplied (applied) to the center of the substrate 2 through a quick-curing resin supply port (nozzle) 11 as indicated by arrow A in FIG. 7. In a positioning stage S2, the semiconductor chip 1 and the substrate 2 are positioned so that the bumps 3 are brought into alignment with the wiring patterns 5 respectively. Thereafter, the semiconductor chip 1 is fixed to the substrate 2 as indicated by arrow B in FIG. 7. Since the quick-curing resin 10 has flowability upon bonding, the quick-curing resin 10 is extended to a uniform thickness upon bonding by being sandwiched between the semiconductor chip 1 and the substrate 2 as shown in FIG. 5 even if the thickness of the quick-curing resin 10 is non-uniform upon its supply as shown in FIG. 7. The cooling of the semiconductor chip 1 and the substrate 2 subsequent to a pressurizing/heating stage S3 is carried out after the quick-curing resin 10 has been hardened.

In the structure according to the second embodiment, the semiconductor chip 1 and the substrate 2 are firmly bonded or joined to one another by three joining powers: a joining power developed between the bumps 3 and the wiring patterns 5, a joining power produced by the quick-curing resin 10 and a joining power produced by a sealing resin layer 7 in a manner similar to the first embodiment. When the thermal expansion coefficients of the quick-curing resin 10 serving as the bonding material and the substrate 2 are set substantially equal to each other, a stress that acts upon cooling subsequent to the pressurizing/heating stage, is dispersed in a manner similar to the first embodiment. It is thus possible to avoid the production of cracks in the semiconductor chip 1.

Figure 8:
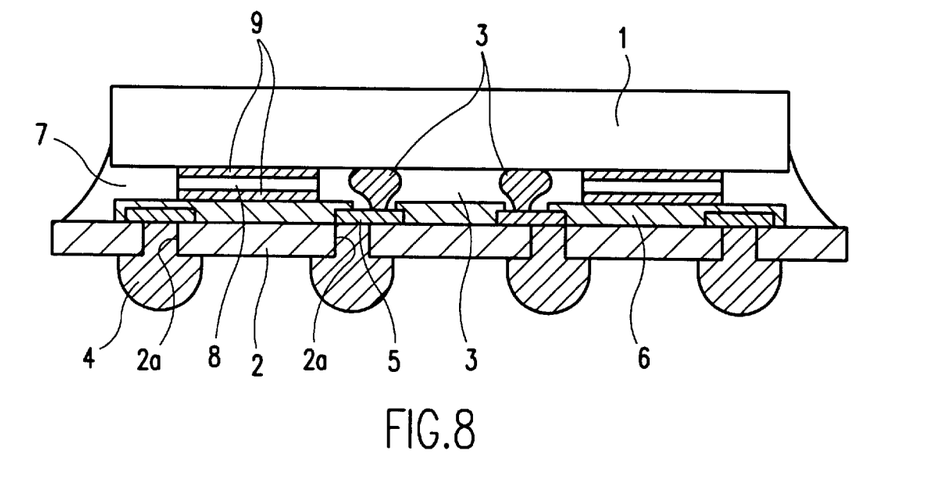
FIG. 8 is a cross-sectional view illustrating a structure for packaging a semiconductor chip, according to a third embodiment of the present invention.
Figure 9A:
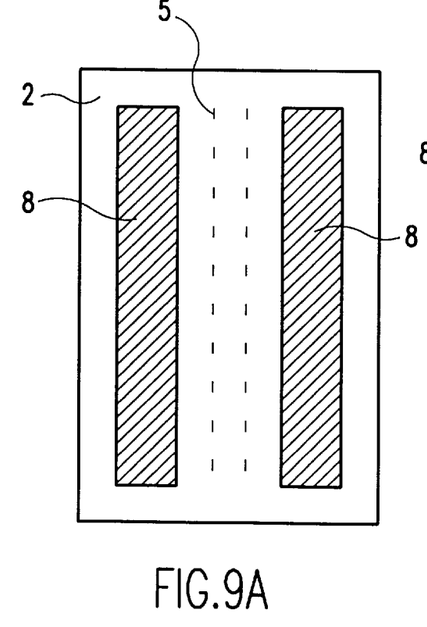
FIG. 9 is a plan view depicting a substrate of the packaged structure shown in FIG. 8.
Figure 9B:
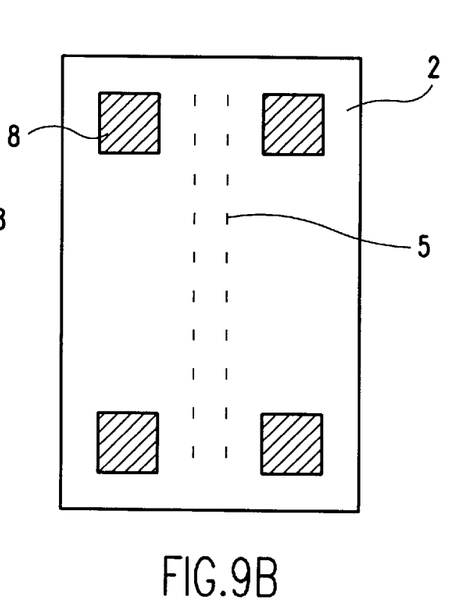

FIG. 8 is a cross-sectional view showing a structure for packaging a semiconductor chip, according to a third embodiment of the present invention. In the third embodiment, polyimide tapes 8 each having a thickness substantially identical to that of each of bumps 3 is used as a joining material. In the third embodiment, wiring patterns 5 on a substrate 2, which correspond to the bumps 3, are placed in the center of the substrate 2 in two rows as shown in FIGS. 9(A) and 9(B). Further, the polyimide tapes 8 used as the joining materials are placed around the wiring patterns 5. The polyimide tapes 8 may be affixed to both sides of the wiring patterns 5 as two regions as shown in FIG. 9(A). Alternatively, the polyimide tapes 8 may be separated into four points and placed on both sides thereof as shown in FIG. 9(B).

A method of packaging the structure according to the third embodiment is common to the first embodiment shown in FIG. 3 except for the positions of placement of the polyimide tapes 8 in a joining material laying-out stage S1. In the structure according to the third embodiment, the semiconductor chip 1 and the substrate 2 are firmly joined to each other by three joining powers: a joining power developed between the bumps 3 and the wiring patterns 5, a joining power produced by each polyimide tape 8 and a joining power produced by a sealing resin layer 7 in a manner similar to the first embodiment. Further, since each of the polyimide tapes 8 is provided with a thickness substantially the same as that of each bump 3, pressure applied in a pressurizing/heating stage is distributed not only over the bumps but also over bonded portions of the polyimide tapes 8, thereby making it possible to avoid cracks from being produced in bump forming portions of the semiconductor chip 1. Further, when the thermal expansion coefficients of each polyimide tape 8 used as the joining material and the substrate 2 are set substantially equal to each other, a stress that acts upon cooling subsequent to a pressurizing/heating stage, is dispersed in a manner similar to the first embodiment to thereby make it possible to avoid cracks from being produced in the semiconductor chip 1.

Incidentally, the structure in which the bumps and the wiring patterns 5 are centrally placed as in the third embodiment, increases the potential that the junction between the bumps 3 and the wiring patterns 5 will break when a first allowing the semiconductor chip 1 and the substrate 2 to incline relative to each other acts in a stage prior to the resin sealing, as compared with the structures according to the first and second embodiments, in which the bumps 3 and the wiring patterns 5 are formed around the substrate 2. However, the structure is reinforced owing to the provision of the polyimide tapes 8 as the joining materials as in the third embodiment. Thus, even if the above-described tilting force acts, the junction between the bumps 3 and the wiring patterns 5 can be held.

A description will next be made of the results of simulation of shearing stresses developed in the bumps 3 when the packaged structure using the polyimide tape 8, according to the first embodiment and a packaged structure indicative of a comparative example free from the use of the polyimide tape are cooled subsequent to the pressurizing/heating stage. The simulation was conducted using four types of materials a, b, c and d different from each other in material constants E and $\alpha$ as the substrate 2 as presented in Table 1 shown below. The material constant E indicates a stress developed within the material at the time that it is cooled from 325° C. to 25° C. The material constant $\alpha$ indicates a thermal expansion coefficient.

TABLE 1

| | Substrate Material | Internal Stress E (325° C. −> 25° C.) | Thermal Expansion Coefficient $\alpha$ |
|---|---|---|---|
| a | (polyimide) | 300 kg/mm$^2$ | 15 × 10$^{-6}$/° C. |
| b | (resinous material) | 2000 kg/mm$^2$ | 15 × 10$^{-6}$/° C. |
| c | (ceramic material) | 11000 kg/mm$^2$ | 12 × 10$^{-6}$/° C. |
| d | (ceramic material) | 26000 kg/mm$^2$ | 7 × 10$^{-6}$/° C. |

A main material used for the semiconductor chip 1 is silicon whose material constants E and $\alpha$ are 13270 kg/mm$^2$ and 2.3×10$^{-6}$/°C. respectively (i.e., E=13270 kg/mm$^2$ and $\alpha$=2.3×10−6/°C.). The material constants of the polyimide tape are the same as those of the substrate material a.

Figure 10A:
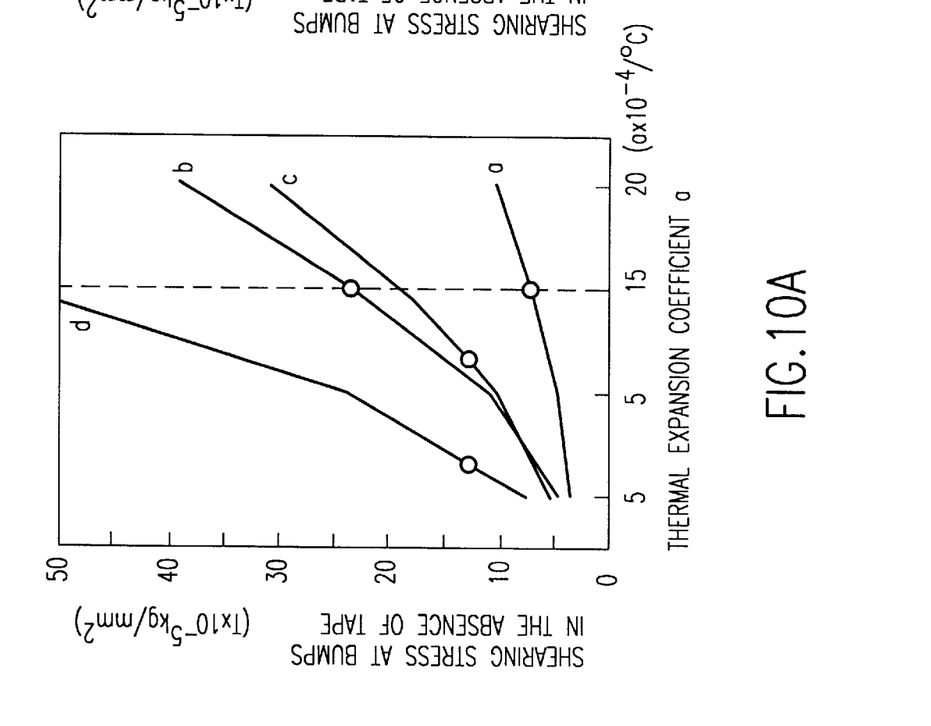
FIG. 10 is a graph illustrating the results of simulation of shearing stresses developed in bumps when the packaged structure of the first embodiment, using a polyimide tape and a packaged structure of a comparative example free from the use of the polyimide tape are cooled after having been pressurized and subjected to the application of heat.
Figure 10B:
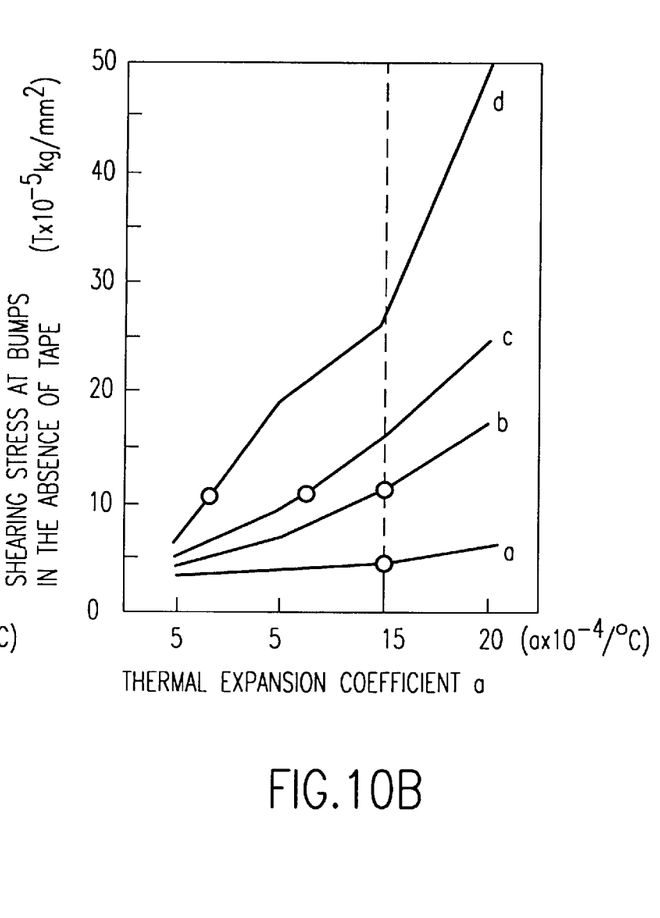

The results of simulation of the shearing stresses are represented by graphs shown in FIGS. 10(A) and 10(B). FIG. 10(A) shows a tap-free comparative example and FIG. 10(B) illustrates values obtained by the first embodiment using the tape. The vertical axes of the respective graphs indicate shearing stresses $\tau$ (unit: $\tau$×10$^{-5}$ kg/mm$^2$) developed in bumps and the horizontal axes thereof indicate thermal expansion coefficients $\alpha$ (unit: $\alpha$×10$^{-6}$/°C.) of the substrate 2. According to the graphs, shearing stresses obtained when the thermal expansion coefficients $\alpha$ of the materials having the internal stresses E shown in Table 1 are varied, are represented by line graphs. Further, the actual thermal expansion coefficients of the respective substrate materials are represented by ○ marks on the graphs. If a change in temperature is kept constant, then the internal stress E and the thermal expansion coefficient $\alpha$ are values inherent in materials. In the present embodiment, however, the thermal expansion coefficients $\alpha$ are assumed to be intended for materials different from the actual substrate materials a through d and the shearing stresses are determined as for the assumed materials. Shearing stresses developed in bumps at the values of the actual thermal expansion coefficients are represented as shown in Table 2.

TABLE 2

| | Substrate Material | Shearing Stress (comparative example) | Shearing Stress (First Embodiment) |
|---|---|---|---|
| a | (polyimide) | 7 × 10$^{-5}$ kg/mm$^2$ | 5 × 10$^{-5}$ kg/mm$^2$ |
| b | (resinous material) | 24 × 10$^{-5}$ kg/mm$^2$ | 11 × 10$^{-5}$ kg/mm$^2$ |
| c | (ceramic material) | 13 × 10$^{-5}$ kg/mm$^2$ | 11 × 10$^{-5}$ kg/mm$^2$ |
| d | (ceramic material) | 13 × 10$^{-5}$ kg/mm$^2$ | 11 × 10$^{-5}$ kg/mm$^2$ |

It can be understood that as shown in Table 2, the shearing stresses developed in bumps employed in the first embodiment using the polyimide tape 8 become smaller in value than those obtained in the comparative example that makes no use of the tape even in the case where any substrate material is used, and the stresses applied to the bumps are distributed even to portions where the polyimide tapes 8 are provided. Particularly when the polyimide identical to the tape is used as the substrate material, the shearing stress thereof can be less reduced as compared with the use of other substrate materials.

According to the packaged structure of the semiconductor chip, as has been described above, since the semiconductor chip and the substrate are firmly joined to one another by the three joining powers: the joining power developed between the bumps and the wiring patterns, the joining power produced by the joining material and the joining power produced by the sealing resin layer, the strong joining power can be obtained even if the joining area of the joining material is small. It is thus possible to reduce the potential that the contact failure will take place due to the deterioration over time.

According to the packaged structure of the semiconductor chip as well, since the thermal expansion coefficient of the substrate is set substantially equal to that of the joining material, the stress developed due to the difference between the semiconductor chip and the substrate upon cooling of both after they have been heated, is distributed not only over the bumps but also over the joining material. It is therefore possible to avoid the concentration of the stress on the local portions of the semiconductor chip and the production of the cracks in the semiconductor chip.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A structure for packaging a semiconductor chip having a plurality of bumps formed on a circuit forming surface thereof, the structure comprising:

a substrate having wiring patterns to which the bumps are joined, said wiring patterns being formed thereon so as to correspond to forming positions of said bumps;

a joining material placed in a portion between said semiconductor chip and said substrate, said joining material comprising a central structure and adhesive layers on contacting surfaces thereof, said joining material joining both to each other at a position excluding the forming positions of said bumps upon positioning; and a resin layer for sealing a spacing defined between said semiconductor chip and said substrate after the two have been joined to each other.

2. A structure according to claim 1, wherein said central structure is a polyimide tape having a thickness substantially identical to that of said each bump.

3. A structure for packaging a semiconductor chip having a plurality of bumps formed on a circuit forming surface thereof comprising:

a substrate having wiring patterns to which the bumps are joined, said wiring patterns being formed thereon so as to correspond to forming positions of said bumps;

a joining material placed in a portion between said semiconductor chip and said substrate, said joining material joining both to each other at a position excluding the forming positions of said bumps upon positioning; and a resin layer for sealing a spacing defined between said semiconductor chip and said substrate after the two have been joined to each other, said joining material being a resin quicker in curing than a resin for forming said resin layer.

4. A structure for packaging a semiconductor chip having a plurality of bumps formed on a circuit forming surface thereof, the structure comprising:

a substrate having wiring patterns to which the bumps are joined, said wiring patterns being formed thereon so as to correspond to forming positions of said bumps;

a joining material placed in a portion between said semiconductor chip and said substrate, said joining material joining both to each other at a position excluding the forming positions of said bumps upon positioning; and a resin layer for sealing a spacing defined between said semiconductor chip and said substrate after the two have been joined to each other, wherein said bumps are provided in the central portion of said semiconductor chip and said joining material joins said semiconductor chip and said substrate at a portion around said semiconductor chip.

5. A structure according to any of claims 1 to 3, wherein said bumps are provided at a portion around said semiconductor chip and said joining material joins said semiconductor chip and said substrate to each other at a central portion of said semiconductor chip.

6. A structure according to any of claims 1 to 3, wherein said bumps are provided in the central portion of said semiconductor chip and said joining material joins said semiconductor chip and said substrate at the portion around said semiconductor chip.

7. A structure according to any of claims 1, 2, 3 or 4, wherein a thermal expansion coefficient of said joining material is substantially identical to that of said substrate.

8. A structure for packaging a semiconductor chip having a plurality of bumps formed on a circuit forming surface thereof, the structure comprising:

a substrate having wiring patterns formed so as to correspond to forming positions of said bumps; and joining materials respectively placed in portions defined between said semiconductor chip and said substrate so as to join the two to one another upon positioning at positions excluding the forming positions of said bumps, said joining material comprising a central structure and adhesive layers on contacting surfaces thereof, said joining material having a thermal expansion coefficient substantially identical to that of said substrate.

9. A structure according to claim 8, further including a resin layer for sealing spacing defined between said semiconductor chip and said substrate after said two have been joined to each other.

10. A structure according to claim 8, wherein said central structure is a polyimide tape having a thickness substantially identical to that of said each bump.

11. A structure according to claim 8, wherein said joining material is a resin quicker in curing than a resin for forming said resin layer.

12. A structure according to claim 8, wherein said bumps are provided in the central portion of said semiconductor chip and said joining material joins said semiconductor chip and said substrate at a portion around said semiconductor chip.

* * * * *